US012712641B2

(12) United States Patent
Seeger

(10) Patent No.: US 12,712,641 B2
(45) Date of Patent: Aug. 18, 2026

(54) SYSTEM AND METHOD FOR SENSING A SIGNAL

(71) Applicant: Rohde & Schwarz GmbH & Co. KG, Munich (DE)

(72) Inventor: Julius Seeger, Prien am Chiemsee (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 650 days.

(21) Appl. No.: 17/961,994

(22) Filed: Oct. 7, 2022

(65) Prior Publication Data

US 2024/0121010 A1 Apr. 11, 2024

(51) Int. Cl.
*H04B 10/70* (2013.01)
*G01M 7/02* (2006.01)
*H03L 7/26* (2006.01)

(52) U.S. Cl.
CPC ............ *H04B 10/70* (2013.01); *G01M 7/025* (2013.01); *H03L 7/26* (2013.01)

(58) Field of Classification Search
None
See application file for complete search history.

(56) References Cited

U.S. PATENT DOCUMENTS 4,456,922 A 6/1984 Balaban et al.
4,870,480 A 9/1989 Chao
5,099,243 A 3/1992 Tsui et al.
5,650,061 A 7/1997 Kuhr et al.
6,477,553 B1 11/2002 Druck
6,850,557 B1 2/2005 Gronemeyer
6,898,582 B2 * 5/2005 Lange .................... G06N 20/00 706/14
9,571,119 B2 2/2017 Flanders et al.
10,784,881 B1 9/2020 Shaddock et al.

(Continued)

FOREIGN PATENT DOCUMENTS

CN 107798378 A * 3/2018 ............. G01S 17/14
DE 102019002017 A1 9/2020

(Continued)

OTHER PUBLICATIONS

Ashok Ajoy, Yi-Xiang Liu, Kasturi Saha, Luca Marseglia, Jean-Christophe Jaskula, Ulf Bissbort, and Paola Cappellaroa, Quantum interpolation for high-resolution sensing, 2017, Research Laboratory of Electronics, Massachusetts Institute of Technology, Cambridge, MA (Year: 2017).*

(Continued)

*Primary Examiner* — Matthew G Marini
(74) *Attorney, Agent, or Firm* — DITTHAVONG, STEINER & MLOTKOWSKI

(57) ABSTRACT

The present disclosure relates to a system for sensing a signal. The system comprises a sampling unit configured to sample the signal, thereby recording a number of sampling points; a reference oscillator configured to provide a reference signal; an alignment unit configured to align the sampling points with the reference signal, thereby correlating each sampling point with a phase value of the reference signal at the respective sampling time of the sampling point; and a processing unit configured to generate a representation of the signal based on the correlation between the sampling points and the phase values.

12 Claims, 6 Drawing Sheets

(56) References Cited

U.S. PATENT DOCUMENTS 11,681,016 B1 * 6/2023 Bohaichuk ......... G01R 29/0885 342/195
2008/0140343 A1 6/2008 Roover et al.
2008/0143573 A1 6/2008 Luthra
2008/0246640 A1 10/2008 Vanderhaegen et al.
2009/0094495 A1 * 4/2009 Torin .................... G01R 23/16 324/555
2009/0122319 A1 5/2009 Ronnekleiv et al.
2009/0306917 A1 12/2009 Kanoh et al.
2011/0134906 A1 6/2011 Garudadri et al.
2012/0075134 A1 3/2012 Rogers et al.
2012/0212360 A1 8/2012 Kanter et al.
2014/0232581 A1 8/2014 Nguyen et al.
2016/0049950 A1 2/2016 Flanders et al.
2017/0356984 A1 12/2017 Halmos
2018/0203091 A1 7/2018 Robinson et al.
2020/0232998 A1 7/2020 Heien et al.
2020/0292606 A1 * 9/2020 Holloway .......... G01R 29/0892
2021/0175892 A1 6/2021 Mueller et al.

FOREIGN PATENT DOCUMENTS

JP 61288584 A2 12/1996
KR 920006335 B1 8/1992
WO 2009016454 A2 2/2009
WO WO-2016209464 A1 * 12/2016 ............ H03M 1/128

OTHER PUBLICATIONS

Christian Schiffer and Andreas R. Diewald, Reconstruction of signal phases for signals closer than the DFT frequency resolution, Feb. 13, 2021, Laboratory of Radar Technology and Optical Systems, Trier University of applied sciences, 54296 Trier, Germany (Year: 2021).*

PatBase Search, PatBase Export, Jul. 25, 2022.

* cited by examiner

SYSTEM AND METHOD FOR SENSING A SIGNAL

TECHNICAL FIELD

The disclosure relates to a system, in particular a quantum sensor system, and to a method for sensing a signal.

BACKGROUND

Quantum sensing is a rapidly growing field which is gaining increasing attention. A quantum sensor utilizes quantum mechanical properties of e.g. atoms to carry out measurements with high sensitivity and precision.

However, for very sensitive applications the preparation of the quantum sensor prior to each measurement and the read-out of the quantum states of the sensor can take more time than the measurement itself. This hinders a fast (or quasi-continuous) sampling of signals. For example, a maximum sampling frequency of a quantum sensor can be in the order of several millihertz (mHz), which is often too low for practical purposes.

To overcome this limitation, it is possible to combine several quantum sensing systems, e.g. several copies of the same system, and to interleave their measurement results. However, this approach is costly and leads to a much more complex measurement setup.

Accordingly, there is a need for an improved system and an improved method for sensing a signal which avoid the above-mentioned disadvantages.

SUMMARY

Embodiments of the present invention advantageously address the foregoing requirements and needs, as well as others, by providing an improved system and an improved method for sensing a signal which avoid the above-mentioned disadvantages.

According to a first aspect, the present disclosure relates to a system for sensing a signal, comprising: a sampling unit configured to sample the signal, thereby recording a number of sampling points; a reference oscillator configured to provide a reference signal; an alignment unit configured to align the sampling points with the reference signal, thereby correlating each sampling point with a phase value of the reference signal at the respective sampling time of the sampling point; and a processing unit configured to generate a representation of the signal based on the correlation between the sampling points and the phase values.

This achieves the advantage that the system can sense the signal even if the sampling rate is low compared to the signal's frequency or the frequency of a signal component of interest.

The signal can be a periodic signal with a fixed frequency. The signal can also comprise a plurality of signal components, at least some of said signal components having a fixed frequency. Thus, the signal can comprise a number of signal components of different frequencies which can be superimposed. The signal may represent an external field, in particular a magnetic field, an electric field or an electromagnetic field, which is examined by the system.

The generated representation of the signal can be a phase representation, i.e., a representation of the signal as a function of phase.

The sampling unit can form or can be comprised by a quantum sensor, in particular a quantum sensor with a long preparation time and, thus, a relatively low sampling rate. Alternatively, the sampling unit can be a slow analog-to-digital converter (ADC).

Each sampling point may comprise a measurement value, in particular the amplitude, of the signal at the respective sampling time. Each sampling point may further comprise a time value which represents the sampling time of the respective sampling point.

The phase value can be a measure of the phase of the reference signal at the respective sampling time. In particular, the phase value is a phase offset or phase delay of the reference signal at the sampling time, e.g., a phase offset or delay to the closest or next zero-crossing of the reference signal.

The reference signal can be a periodic signal with a reference frequency. The reference frequency is preferably higher than the frequency of the signal to be sensed (or of a signal component of the signal).

In an embodiment, the sampling unit is configured to sample the signal at a sampling rate which is lower than twice the frequency of the highest frequency component in the signal. The highest frequency component may refer to a highest frequency component of interest.

Thus, the maximal available sampling rate of the sampling unit can be lower than the sampling rate required to reconstruct the signal according to the Nyquist Shannon sampling theorem. This achieves the advantage that only one sensor, in particular one quantum sensor, is required to sample the signal even if the sampling rate provided by the quantum sensor is relatively low (i.e., the sampling points are far apart relatively to the frequency of interest). This reduces the complexity of the measurement system drastically.

In an embodiment, the system comprises a trigger unit configured to trigger the recording of sampling points at one or more determined phase values of the reference signal.

In an embodiment, each sampling point comprises a measurement value, and the processing unit is configured to map the measurement values of the sampling points to the respective phase values. This achieves the advantage that a phase representation of the signal can be generated.

In an embodiment, the processing unit is configured to average over the recorded measurement values at each phase value or within a certain phase interval in order to enhance a signal-to-noise ratio, SNR. In particular, the SNR of the mapped measurement values and, thus, the representation of the signal can be enhanced in this way.

In an embodiment, the processing unit is configured to interpolate between the mapped measurement values in order to generate the representation of the signal. The thus generated representation of the signal can be a phase representation of the signal.

In an embodiment, the system comprises a display unit configured to display the representation of the signal. Additionally or alternatively, the display unit can be configured to display the individual measurement values of the sampling points at the respective phase values.

In an embodiment, the display unit is configured to display the averaged and non-averaged measurement values.

According to a second aspect, the disclosure relates to a quantum sensor system comprising: the system according to the first aspect of the disclosure; wherein the sampling unit is formed by a quantum sensor of the quantum sensor system.

In an embodiment, the quantum sensor comprises Rydberg atoms, trapped ions, cold atoms/molecules, ultracold atoms/molecules, a degenerate Fermi gas, or a Bose-Einstein condensate. The (ultra)cold atoms/molecules may form a(n) (ultra)cold quantum gas.

The quantum sensor can be configured to analyze electric and/or magnetic fields with high precision.

In an embodiment, the quantum sensor system is configured to analyze electric, magnetic or electromagnetic waves or gravitational anomalies, e.g., to detect water and/or oil reservoirs.

According to a third aspect, the disclosure relates to a method for sensing a signal, comprising the steps of: sampling the signal, thereby recording a number of sampling points; providing a reference signal; aligning the sampling points with the reference signal, thereby correlating each sampling point with a phase value of the reference signal at the respective sampling time of the sampling point; and generating a representation of the signal based on the correlation between the sampling points and the phase values.

In an embodiment, each sampling point comprises a measurement value, and the method comprises the further step of: mapping the measurement values of the sampling points to the respective phase values.

In an embodiment, the method comprises the further step of: averaging over the recorded measurement values at each phase value or within a certain phase interval to enhance the signal-to-noise ratio, SNR, of the representation of the signal. For instance, the SNR of the representation of the signal can be enhanced in this way.

In an embodiment, the method comprises the further step of: interpolating between the mapped measurement values in order to generate a representation of the signal.

The above description with regard to the system according to the first aspect of the disclosure and the quantum sensor system according to the second aspect of the disclosure is correspondingly valid for the method according to the third aspect of the disclosure.

BRIEF DESCRIPTION OF THE DRAWINGS

The above-described aspects and implementation forms of the present disclosure will be explained in the following description of specific embodiments in relation to the enclosed drawings, in which.

DETAILED DESCRIPTION

An improved system and an improved method for sensing a signal is described. In the following description, for the purposes of explanation, numerous specific details are set forth in order to provide a thorough understanding of the invention. It is apparent, however, that the invention may be practiced without these specific details or with an equivalent arrangement. In other instances, well-known structures and devices are shown in block diagram form in order to avoid unnecessarily obscuring the invention.

A processor, unit, module or component (as referred to herein) may be composed of software component(s), which are stored in a memory or other computer-readable storage medium, and executed by one or more processors or CPUs of the respective devices. A module or unit may alternatively be composed of hardware component(s) or firmware component(s), or a combination of hardware, firmware and/or software components. Further, with respect to the various example embodiments described herein, while certain of the functions are described as being performed by certain components or modules (or combinations thereof), such descriptions are provided as examples and are thus not intended to be limiting. Accordingly, any such functions may be envisioned as being performed by other components or modules (or combinations thereof), without departing from the spirit and general scope of the present invention. Moreover, the methods, processes and approaches described herein may be processor-implemented using processing circuitry that may comprise one or more microprocessors, application specific integrated circuits (ASICs), field programmable gate arrays (FPGAs), or other devices operable to be configured or programmed to implement the systems and/or methods described herein. For implementation on such devices that are operable to execute software instructions, the flow diagrams and methods described herein may be implemented in processor instructions stored in a computer-readable medium, such as executable software stored in computer memory storage.

Figure 1:
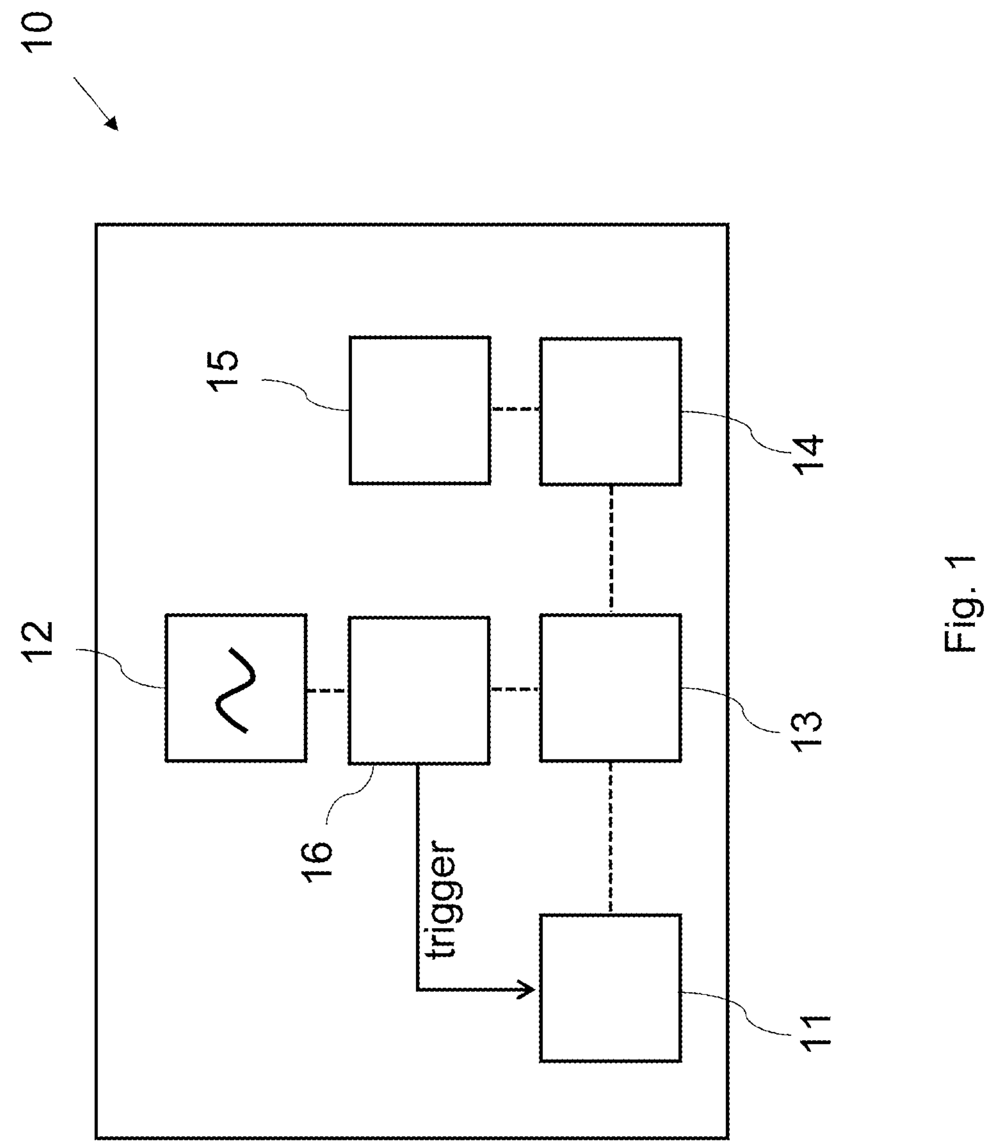
FIG. 1 shows a schematic diagram of a system for sensing a signal according to an embodiment.

FIG. 1 shows a system 10 for sensing a signal according to an embodiment.

The system 10 comprises a sampling unit 11 configured to sample the signal, thereby recording a number of sampling points; and a reference oscillator 12 configured to provide a reference signal. The system 10 further comprises an alignment unit 13 configured to align the sampling points with the reference signal, thereby correlating each sampling point with a phase value of the reference signal at the respective sampling time of the sampling point; and a processing unit 14 configured to generate a representation of the signal based on the correlation between the sampling points and the phase values.

The signal to be sensed can be a periodic signal with a fixed frequency. The signal can also comprise a plurality of signal components, wherein at least one of the signal components has a fixed frequency. Thus, the signal can comprise a number of signal components which can be superimposed. The signal may represent an external field, in particular a magnetic field, an electric field or an electromagnetic field, which is sensed by the system 10. For instance, the signal represents a magnetic field which is disturbed by magnetic field fluctuations. The system 10 can be configured to compensate these fluctuations.

The reference oscillator 12 can be a local oscillator. The reference signal can be a periodic signal or a CW signal. In particular, the frequency of the reference signal is equal or higher than the frequency of the signal to be sensed or of the frequency components of interest of the signal to be sensed.

Each sampling point generated by the sampling unit may comprise a measurement value, in particular the amplitude, of the signal at the respective sampling time, and a time value which represents the sampling time.

The alignment unit 13 can be configured to correlate the measurement value of a sampling point with the phase value of the reference signal at the sampling time of the sampling point.

The phase value can be a phase offset or a phase delay of the reference signal at the respective sampling time. E.g., an offset to the closest or next zero crossing of the reference signal.

The sampling unit 11 can be a quantum sensor with a long preparation time before each measurement and, thus, a relatively low sampling rate. This can be due to the relatively long time required for initialization and read-out of the quantum sensor.

In particular, the sampling unit 11 is configured to sample the signal at a sampling rate which is lower than twice the frequency of the highest frequency component of the signal or which is lower than twice the highest frequency of signal component of interest. Thus, the sampling rate can be lower than a sampling rate required to fully resolve the signal (or the signal component of interest) according to the Nyquist Shannon sampling theorem.

The system 10 can overcome this limitation imposed by the Nyquist Shannon sampling theorem by providing the reference frequency with the reference oscillator 12 and using the alignment unit 13 to ensure that the different sampling points, which are relatively far apart in time, have a fixed phase relation to the reference frequency.

The processing unit 14 can be configured to map the measurement values of the sampling points to the respective phase values based on said phase relation. The processing unit 14 can further be configured to interpolate between the mapped measurement values in order to generate the representation of the signal. The representation of the signal can thus be a phase representation of the signal, i.e. the signal over phase instead of time.

The processing unit 14 can be further configured to average over the recorded measurement values at each phase value or within a certain phase interval in order to enhance a signal-to-noise ratio, SNR. By this averaging, a precise amplitude or DC value at each phase or phase interval can be determined. The averaging can be carried out in a post processing step.

The processing unit 14 can be configured to convert the phase representation of the signal to a time representation for certain frequencies of interest, in particular during said post processing.

Optionally, the system 10 may further comprise a trigger unit 16 which is configured to trigger the recording of sampling points at determined phase values of the reference signal. This achieves the additional advantage that the averaging requires fewer measurement points.

The trigger unit 16 can be configured to trigger the recording of the sampling points at selective phase values, e.g. with fixed distance to each other, such that the phase representation of the signal can have a fixed effective sampling rate (in phase).

The system can comprise an optional display unit 15. The display unit 15 can be configured to display the representation of the signal that was generated by the processing unit 14. The display unit 15 can also display the individual measurement values of the sampling points at the respective phase values. The display unit 15 can further be configured to display the averaged measurement values together with the non-averaged measurement values.

For instance, the processing unit 14 comprises a microprocessor. The processing unit 14 can be a computing device. The display unit 15 can be a display of the computing device.

The system 10 may comprise an interface (not shown in FIG. 1) for receiving the signal and for feeding the signal to the sampling unit 11.

Figure 2:
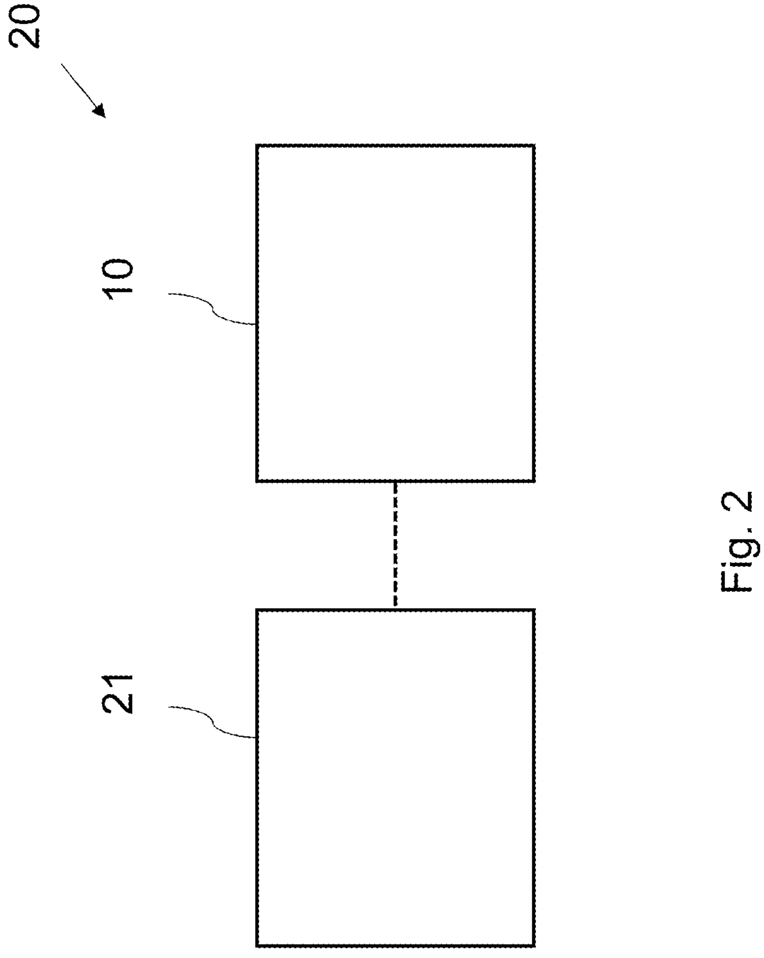
FIG. 2 shows a schematic diagram of a quantum sensor system according to an embodiment.

FIG. 2 shows a schematic diagram of a quantum sensor system 20 according to an embodiment.

The quantum sensor system 20 comprises the system of FIG. 1 and a quantum sensor 21. The quantum sensor 21 may form or comprise the sampling unit 11 of the system 10. The sampling unit 11 may also be comprised by the quantum sensor 20.

The quantum sensor 21 can employ Rydberg atoms, trapped ions, cold atoms/molecules, ultracold atoms/molecules, a degenerate Fermi gas, or a Bose-Einstein condensate. For instance, the quantum sensor 21 can be configured to carry out measurements based on induced changes in the quantum properties of the cold or ultracold atoms or molecules, or of Bose-Einstein quantum states.

For instance, the quantum sensor 21 may comprise a magneto-optical trap containing atoms which are cooled down to ultracold temperatures using, e.g., a forced rf-evaporation process. A Bose-Einstein condensate or a degenerate Fermi gas can then be generated via a further evaporation step. For instance, this degenerate gas can be loaded in an optical lattice of the quantum sensor 21 to perform the measurements.

In general, the quantum sensor system 20 can used to analyze electric and/or magnetic fields with high precision. For instance, the quantum sensor system 20 can be used to analyze electric, magnetic or electromagnetic waves, and/or gravitational anomalies, e.g. to detect water and/or oil reservoirs.

Figure 3A:
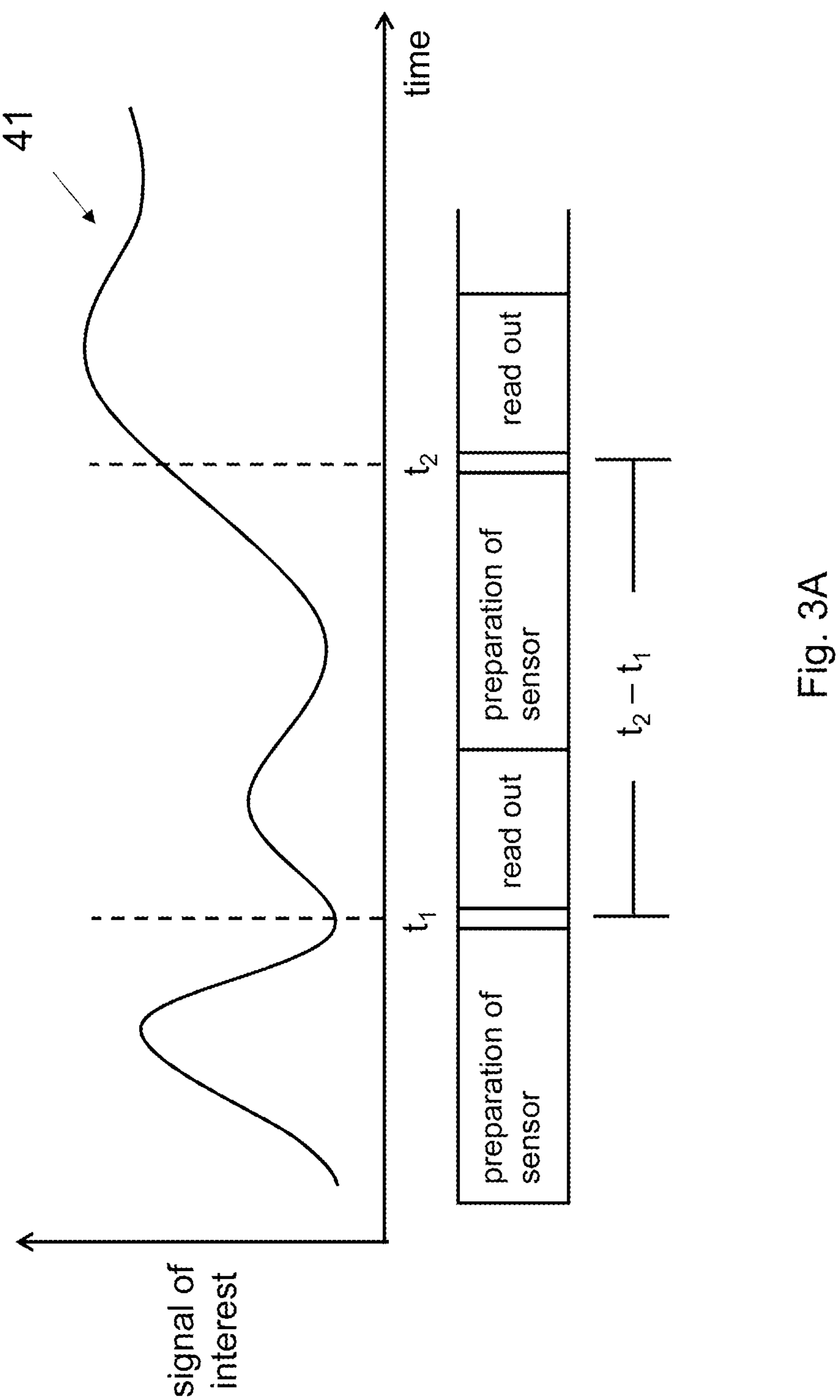
FIGS. 3A-B show a sampling of a signal according to an embodiment.
Figure 3B:
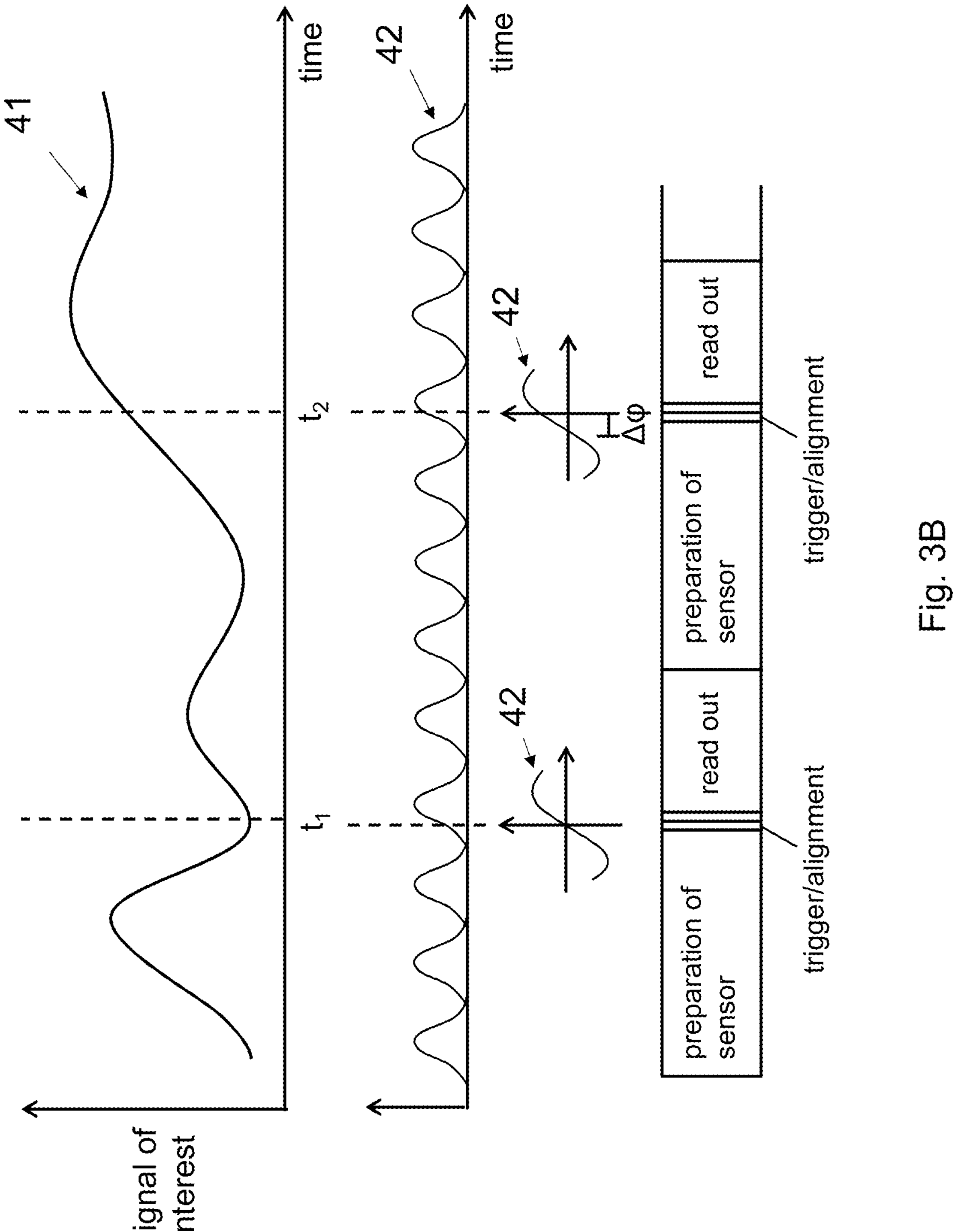

FIGS. 3A-B show a sampling of the signal 41 according to an embodiment.

FIG. 3A shows sampling of the signal 41 with the two sampling points recorded at times t1 and t2. The time interval (t2−t1) between these sampling points can be relatively large due to limitations of the sampling unit 11. For example, this relatively low sampling rate can be caused by the necessary preparation steps of the sampling unit 11, e.g., preparation and read-out steps as shown in FIG. 3A.

When using the quantum sensor 21 as sampling unit 11, a necessary preparation time of the sensor 21 can be up to 40s and the sampling rate can be in the millihertz range. For instance, the quantum sensor 21 comprises cold or ultracold atoms, or a Bose-Einstein condensate as sensing elements. These sensing elements are highly sensitive but are typically prepared before each measurement which may take some time and cause the low sampling rate.

The Nyquist Shannon theorem states that a signal has to be sampled at a rate which is at least twice the frequency of the highest frequency component in the signal. In other words, the maximum frequency resolution according to the Nyquist Shannon theorem is:

$$\frac{1}{2}\frac{1}{t_2 - t_1}$$

Thus, the time interval ($t_2$−$t_1$) provided by the sampling unit 11 might be too long (i.e., the sampling rate too low) to resolve the signal 41 (or all signal components of interest of the signal 41) according to the Nyquist Shannon sampling theorem. To overcome this limitation, the system 10 uses the reference signal 42 provided by the reference oscillator 12 and aligns the sampling points with this reference signal 42 as shown in FIG. 3B. With this trigger and/or alignment step, each sampling point can be correlated with a phase shift (or phase delay) $\Delta\phi$ of the reference oscillator.

The phase shift/delay introduced by the trigger 16 and/or alignment 13 unit varies for the different sampling points. The sampled measurement values can thus be evaluated in dependence of the phase increment of the trigger 16 and/or alignment 13 unit and not the time between the sampling points.

The sampling points, in particular their measurement value, can be mapped to the respective phase shift $\Delta\phi$ to generate a phase representation of the signal, e.g. via an additional interpolation step.

Figure 4:
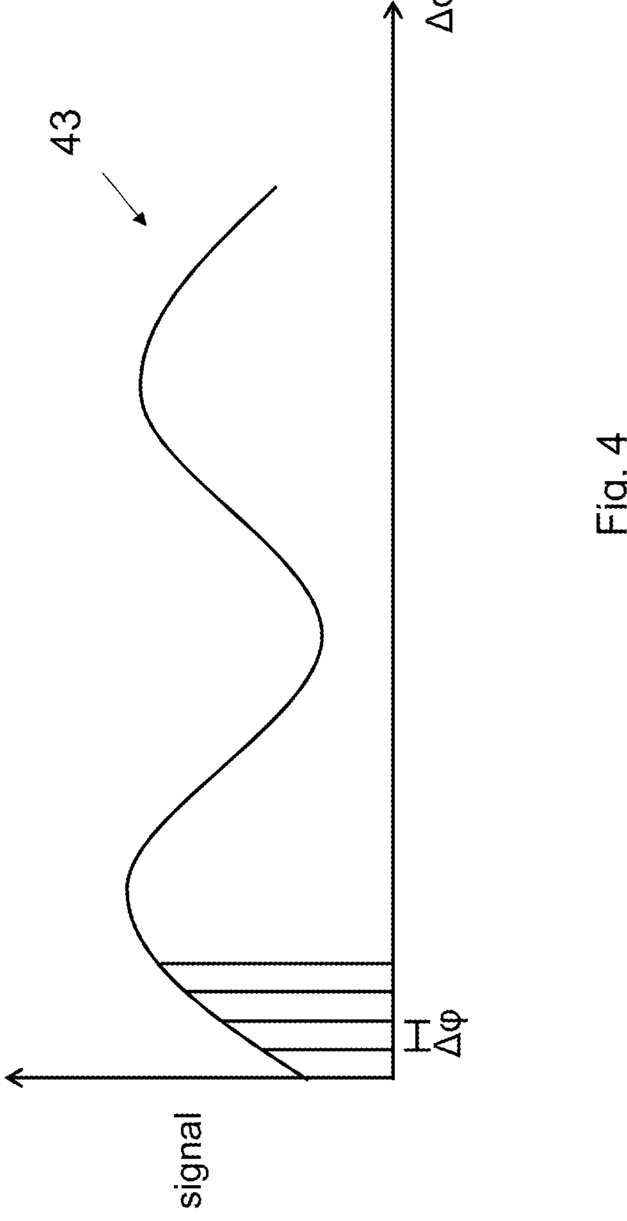
FIG. 4 shows a representation of a signal according to an embodiment.

FIG. 4 shows such a (phase) representation 43 of the signal according to an embodiment. In this representation 43 of the signal, the time resolution is given by the phase increment instead, which can be chosen arbitrarily and does not depend on the preparation and read-out times of the sampling unit 11.

For instance, the phase increment of the representation 43 can be chosen in the trigger unit 16 or determined by the alignment unit 13 and is, thus, not determined by the time interval $(t_2-t_1)$ between adjacent sampling points. In particular, the trigger unit 16 and/or alignment unit 13 can be used to make sure that the different sampling points lying far away in time have a fixed phase relation to the reference oscillator.

In this way, the resolution of the signal can be enhanced by several orders of magnitude. Additionally, sensitivity at frequencies of interest can be increased by selection of a suitable reference oscillator frequency. Broadband noise can be averaged out to some extend which further increases the sensitivity.

In this way, the sensitivity of the system 10 at the frequencies of the reference oscillator is strongly enhanced, especially for all frequency components that have a strong correlation to the reference frequency.

The system 10 can use the trigger unit 16 to trigger the measurement to a specific phase of the reference oscillator 12. In this way, all frequencies that are correlated with the reference oscillator can be sampled, e.g. all signal components which have a common phase information, such as harmonics, subharmonics, third harmonics etc. Thus, the noise can be further reduced.

For example, the measurement can be repeated ten times for one phase increment to enhance the sensitivity and reduce the noise. Frequency components not matching the reference frequency will vary in phase, i.e. they have a different phase delay and will average out.

The system 10 is especially suitable to sense periodic signal components in the signal of interest which are present during the whole sampling time. Knowing the frequency of interest, especially a narrow band frequency of interest, can greatly enhance the precision of the measurement as a suitable reference frequency can be chosen.

The above approach allows overcoming the Nyquist Shannon theorem without implementing several systems in parallel, which would be quite expensive and require additional hardware. In addition, the above approach provides direct and more precise measurement results compared to other measurement methods, such as: comparing a recorded signal to examples of sampled signals in a library, sample and hold (SHA) schemes, predictive sampling, level crossing triggers, or analog down conversion. However, the above approach could be combined with any of these measurement methods.

Figure 5:
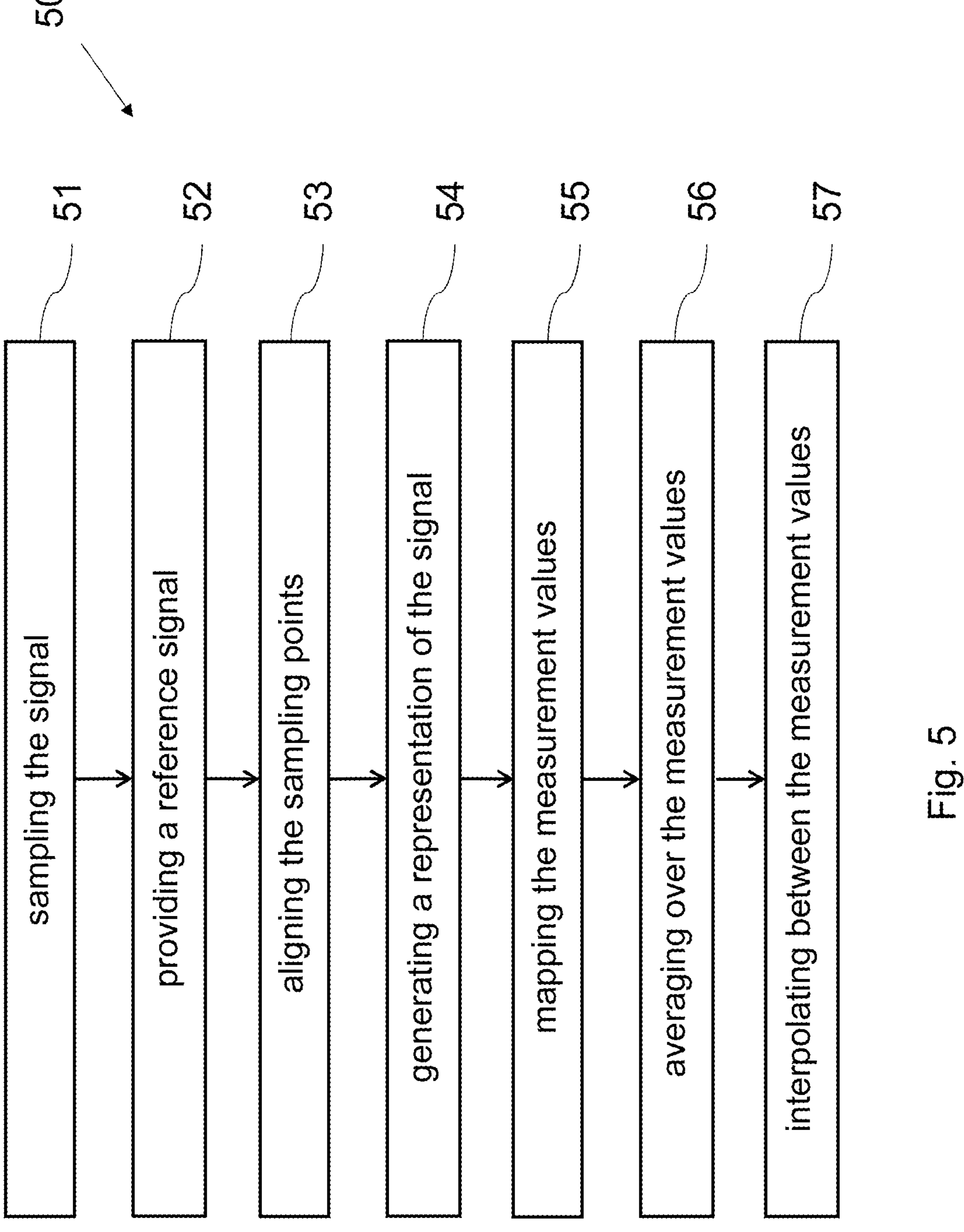
FIG. 5 shows a flow chart of a method for sensing a signal according to an embodiment.

FIG. 5 shows a flow chart of a method 50 for sensing a signal according to an embodiment. For instance, the method 50 can be used to sense the signal 41 shown in FIG. 3A.

The method 50 for sensing the signal, comprising the steps of: sampling 51 the signal, thereby recording a number of sampling points; providing the reference signal 52; aligning 53 the sampling points with the reference signal, thereby correlating each sampling point with the phase value of the reference signal at the respective sampling time of the sampling point; and generating 54 the representation 43 of the signal based on the correlation between the sampling points and the phase values.

In addition, the method 50 may comprise the optional steps of: mapping 55 the measurement values of the sampling points to the respective phase values.

The method 50 may further comprise the optional steps of: averaging 56 over the recorded and/or mapped measurement values at each phase value or within a certain phase interval to enhance the SNR of the representation of the signal; and/or interpolating 57 between the mapped, e.g. averaged, measurement values in order to generate a representation 43 of the signal.

The method 50 shown in FIG. 5 can be carried out by any one of the systems 10, 20 shown in FIGS. 1 and 2.

All features described above or features shown in the figures can be combined with each other in any advantageous manner within the scope of the disclosure.

What is claimed is:

1. A system, comprising:

a sampling unit configured to sample a signal, and to record a number of sampling points;

a reference oscillator configured to provide a reference signal;

an alignment unit configured to align the sampling points with the reference signal, and to correlate each sampling point with a phase value of the reference signal at a respective sampling time of the sampling point, wherein the phase value is a measurement of a phase shift of the reference signal at the sampling time; and a processing unit configured to generate a representation of the signal based on the correlation between the sampling points and the phase values, wherein the sampling unit is configured to sample the signal at a sampling rate which is lower than twice the frequency of the highest frequency component in the signal, wherein the highest frequency component in the signal corresponds to a highest frequency of interest, and wherein each sampling point comprises a measurement value, and wherein the processing unit is configured to map the measurement values of the sampling points to the respective phase values based on a phase relation to the frequency of the reference signal.

2. The system of claim 1, wherein the system comprises a trigger unit configured to trigger the recording of sampling points at one or more determined phase values of the reference signal.

3. The system of claim 1, wherein the processing unit is configured to average over the recorded measurement values at each phase value or within a certain phase interval in order to enhance a signal-to-noise ratio, SNR.

4. The system of claim 3, wherein the processing unit is configured to interpolate between the mapped measurement values in order to generate the representation of the signal.

5. The system of claim 4, wherein the display unit is configured to display the averaged and non-averaged measurement values.

6. The system of claim 3, wherein the display unit is configured to display the averaged and non-averaged measurement values.

7. The system of claim 1, wherein the processing unit is configured to interpolate between the mapped measurement values in order to generate the representation of the signal.

8. The system of claim 1, wherein the system further comprises a display unit configured to display the representation of the signal.

9. A quantum sensor system, comprising:

a sampling unit configured to sample a signal, and to record a number of sampling points, wherein the sampling unit is formed by a quantum sensor of the quantum sensor system;

a reference oscillator configured to provide a reference signal;

an alignment unit configured to align the sampling points with the reference signal, and to correlate each sampling point with a phase value of the reference signal at a respective sampling time of the sampling point, wherein the phase value is a measurement of a phase shift of the reference signal at the sampling time; and a processing unit configured to generate a representation of the signal based on the correlation between the sampling points and the phase values, wherein the sampling unit is configured to sample the signal at a sampling rate which is lower than twice the frequency of the highest frequency component in the signal, wherein the highest frequency component in the signal corresponds to a highest frequency of interest, and wherein each sampling point comprises a measurement value, and wherein the processing unit is configured to map the measurement values of the sampling points to the respective phase values based on a phase relation to the frequency of the reference signal.

10. The quantum sensor system of claim 9, wherein the quantum sensor comprises Rydberg atoms, trapped ions, cold atoms/molecules, ultracold atoms/molecules, a degenerate Fermi gas, or a Bose-Einstein condensate.

11. The quantum sensor system of claim 9, wherein the quantum sensor system is configured to analyze electric waves, magnetic waves, electromagnetic waves, or gravitational anomalies.

12. A system for sensing a signal, comprising:

a sampling unit configured to sample the signal, and to record a number of sampling points;

a reference oscillator configured to provide a reference signal;

an alignment unit configured to align the sampling points with the reference signal, and to correlate each sampling point with a phase value of the reference signal at a respective sampling time of the sampling point, wherein the phase value is a measurement of a phase shift of the reference signal at the sampling time; and a processing unit configured to generate a representation of the signal as a function of phase based on the correlation between the sampling points and the phase values, wherein each sampling point comprises a measurement value, and wherein the processing unit is configured to map the measurement values of the sampling points to the respective phase values based on a phase relation to the frequency of the reference signal, and wherein the processing unit is configured to convert the representation of the signal as the function of phase to a time representation of the signal for one or more frequencies of interest.

* * * * *